(12) United States Patent
Guyette et al.

(10) Patent No.: US 10,270,480 B1
(45) Date of Patent: Apr. 23, 2019

(54) SIGNAL-TRACKING RF BANDSTOP FILTER

(71) Applicant: The United States of America, as represented by the Secretary of the Navy, Washington, DC (US)

(72) Inventors: Andrew C. Guyette, San Mateo, CA (US); Eric J. Naglich, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/726,579

(22) Filed: Oct. 6, 2017

(51) Int. Cl.
  *H03H 7/01* (2006.01)
  *H04B 1/10* (2006.01)
  *H03J 3/06* (2006.01)
  *H03H 7/12* (2006.01)

(52) U.S. Cl.
  CPC ......... *H04B 1/1036* (2013.01); *H03H 7/0153* (2013.01); *H03H 7/12* (2013.01); *H03H 7/1741* (2013.01); *H03J 3/06* (2013.01)

(58) Field of Classification Search
  CPC ...... H03H 7/0153; H03H 7/12; H03H 7/1741; H03J 3/06; H04B 1/1036; H04B 1/1063
  USPC ......................................... 327/551, 552, 556
  See application file for complete search history.

(56) References Cited

U.S. PATENT DOCUMENTS

| 10,056,662 B2 * | 8/2018 | Guyette | .................... H01P 1/10 |
| 2015/0035622 A1 * | 2/2015 | Maxim | ................... H03F 1/565 |
| | | | 333/202 |

* cited by examiner

*Primary Examiner* — William Hernandez
(74) *Attorney, Agent, or Firm* — US Naval Research Laboratory; William P. Ladd

(57) ABSTRACT

Systems and methods are provided for implementing bandstop filters (e.g., RF/microwave bandstop filters) that can automatically tune to a frequency of an interfering signal. Embodiments of the present disclosure provide automatically tunable signal-tracking bandstop filters with a significant reduction in response time, complexity, size, weight, and cost when compared to conventional devices.

20 Claims, 6 Drawing Sheets

SIGNAL-TRACKING RF BANDSTOP FILTER

FIELD OF THE DISCLOSURE

This disclosure relates to filters, including bandstop filters.

BACKGROUND

In electronic circuit systems, unwanted signals can lower the dynamic range of a system or damage it if the power level is high enough. Bandstop filters can be used (e.g., in radio frequency (RF) and microwave systems) to reject unwanted signals from entering a receiver or leaving a transmitter. For example, bandstop filters can be used in RF and microwave systems to remove unwanted signals over a specific frequency range while passing signals with frequencies that fall outside of that range. These unwanted signals can originate from co-site or externally generated interference as well as nonlinear components under high-power excitation in the system.

Bandstop filters used in RF/microwave systems can be made tunable to excise unwanted signals at specific frequencies. Precise center-frequency tuning requires significant digital processing and adds delay. Conventional devices have high response time, complexity, size, weight, computation power, and cost. Further, conventional devices require a system to analyze a spectrum, compute an ideal filter frequency, and tune a filter with dedicated control signals. Additionally, conventional devices require temperature and vibration compensation, which adds significant overhead to the receiver.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings:

FIG. 2 includes an analog control circuit;

Figure 1A:
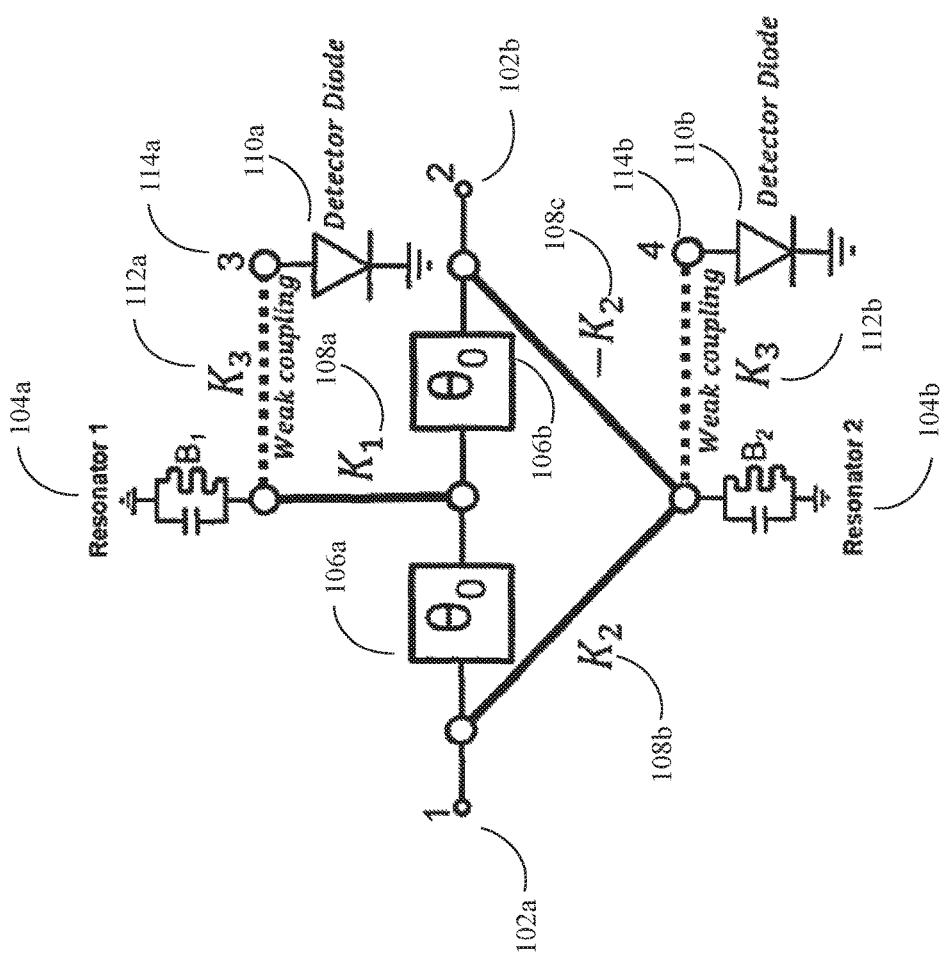
FIG. 1A is a diagram of an exemplary bandstop filter in accordance with an embodiment of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. Overview

Embodiments of the present disclosure provide systems and methods for implementing bandstop filters (e.g., RF/microwave bandstop filters) that can automatically tune to a frequency of an interfering signal. In an embodiment, an automated control circuit can direct a filter to signals above a predefined power threshold. Embodiments of the present disclosure provide automatically tunable signal-tracking bandstop filters with a significant reduction in response time, complexity, size, weight, and cost when compared to conventional devices. Embodiments of the present disclosure remove the need for actively controlling a tunable bandstop filter with system computational resources, reducing the latency, power and processing capability required for an adaptable system. For example, a bandstop filter in accordance with an embodiment of the present disclosure can automatically track a signal over a 20% bandwidth and provide more than 40 dB attenuation.

A tunable bandstop filter in accordance with an embodiment of the present disclosure can automatically follow a target signal without computation requirements, human operators, or system control signals. Embodiments of the present disclosure can decrease the response time of reconfigurable bandstop filters by integrating their control into the RF circuitry instead of using digital control, which induces lag time.

Because it is difficult to accurately control tunable filters, tunable filters have not been used in many practical systems. Embodiments of the present disclosure address this problem by enabling bandstop filters to be tuned by signals that they are intended to reject, allowing the bandstop filters to be tuned more easily. Applications that cannot tolerate the time delay or computational overhead associated with conventional filters can benefit from the faster, more independent filters enabled by embodiments of the present disclosure.

Embodiments of the present disclosure provide systems and methods for designing sensors (e.g., using signal-sensing analog electronics in an embodiment) into RF/microwave filters and for tuning the RF/microwave filters based on the outputs of these sensors. Embodiments of the present disclosure include bandstop filter topology that incorporates sensing locations in the circuit with a frequency response that is constant regardless of how much the filter is attenuating a desired signal.

2. Exemplary Bandstop Filter

FIG. 1A is a diagram of an exemplary bandstop filter in accordance with an embodiment of the present disclosure. FIG. 1A shows a Bridged-T filter topology with detectors 110 (e.g., detector diodes) weakly coupled to two resonators 104. For example, in an embodiment, this weak coupling can involve placing detectors 110 close enough to resonators 104 such that detectors 110 can sense power (e.g., through air between detectors 110 and resonators 104) from resonators 104 and generate a voltage based on this sensed power. For example, in an embodiment, detectors 110 are placed close enough to resonators 104 such that detectors 110 sense 0.1% of the power (and/or voltage) generated by resonators 104. In an embodiment, weak coupling can also be obtained by inserting a circuit element, such as an inductor or capacitor, between a resonator (e.g., resonator 104a) and detector (e.g., detector 110a).

In FIG. 1A, resonators 104 are coupled through a through line with an input at port 1 102a and an output is at port 2 102b. In the topology of FIG. 1A, resonators 104 are coupled via couplings 108a, 108b, and 108c separated by phase shifts 106a and 106b. In FIG. 1A, detector 110a is weakly coupled to resonator 104a, via coupling 112a, at port 3 114a. Detector 110b is weakly coupled to resonator 104b, via coupling 112b, at port 4 114b. In an embodiment, detectors 110 are co-designed into the filter of FIG. 1A in such a way as to provide a frequency-selective voltage response to high-power signals. While detectors 110 are shown in FIG. 1A, it should be understood that a variety of detector devices can be used in accordance with embodiments of the present disclosure.

In an embodiment, under the following conditions a bandstop response is obtained between ports 1 and 2:

$$B_2 = -\frac{2\omega_{0b} + K_1^2 \cot(\theta_0 + 1)}{2} \text{ and} \quad (1)$$

$$B_1 = -\frac{K_1^2 - 2\omega_{0b}}{2} \quad (2)$$

where $B_1$ and $B_2$ are susceptance values for the resonators and $\omega_{0b}$ is the desired bandstop center frequency for the filter. The transfer function can be represented as:

$$S_{12} = e^{-2\theta_0} \frac{(p - j\omega_{0b})^2}{(K_1^2 + (1-j)(p - j\omega_{0b}))(K_1^2 + (1+j)p + (1-j)\omega_{0b})} \quad (3)$$

$$|S_{12}|^2 = -\frac{4(\omega - \omega_{0b})^4}{4(\omega - \omega_{0b})^4 + K_1^8} \quad (4)$$

where p represents a complex frequency variable for radian frequency (e.g., jω, sometimes represented as s). The transfer functions between the input and the two detectors can be given by:

$$|S_{31}|^2 = -\frac{4K_1^2 K_3^2}{(2K_3^2 + K_1^2) + 4(\omega - \omega_{0s1})^2} \text{ and} \quad (5)$$

$$|S_{41}|^2 = -\frac{4K_1^2 K_3^2}{(2K_3^2 + K_1^2) + 4(\omega - \omega_{0s2})^2} \quad (6)$$

where $\omega_{0s1}$ and $\omega_{0s2}$ are the center frequencies of the sensor responses:

$$\omega_{0s1} = -B_1 = \omega_{0b} - \frac{K_1^2}{2} \quad (7)$$

$$\omega_{0s2} = -B_2 - K_1^2 \cot\theta_0 = \omega_{0b} + \frac{K_1^2}{2} \quad (8)$$

Figure 1B:
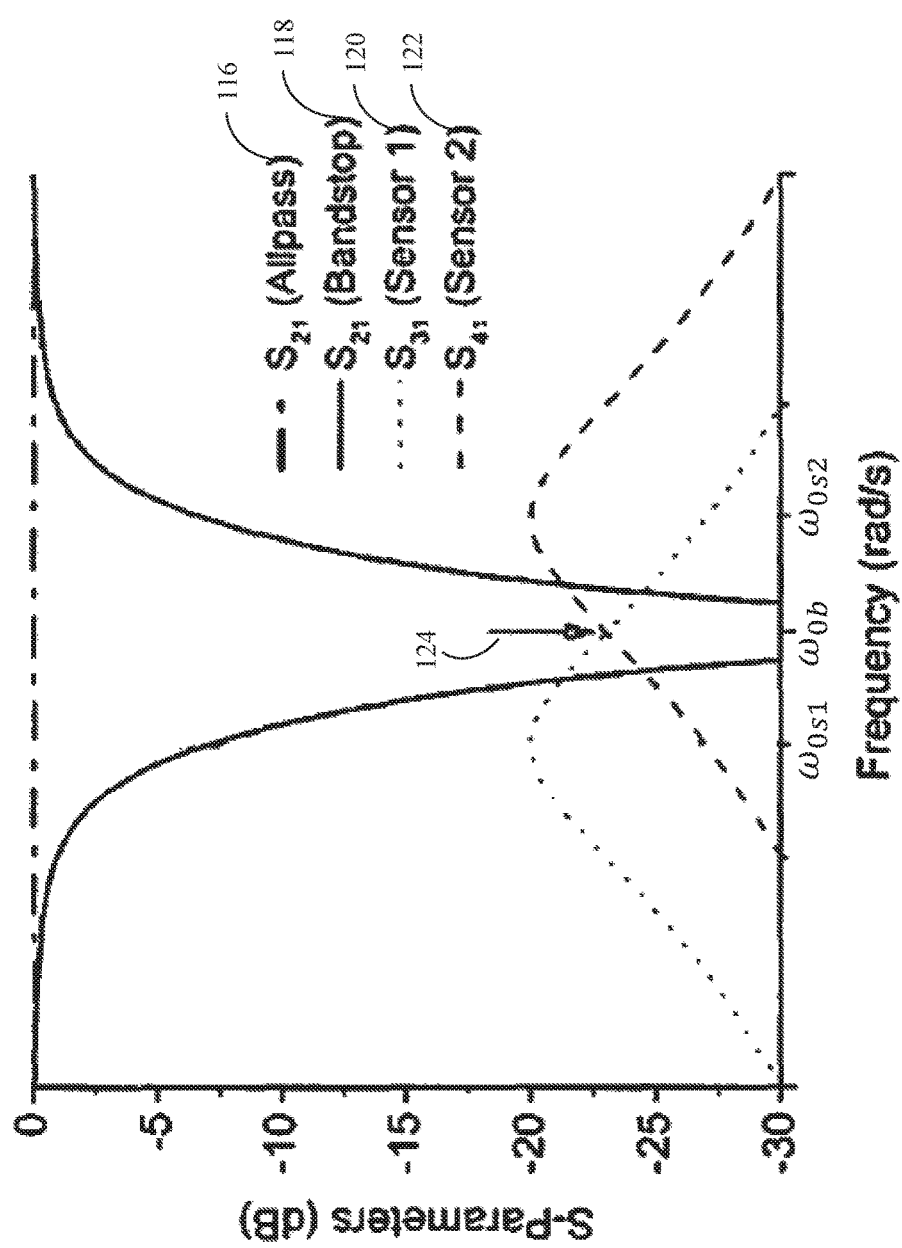
FIG. 1B is a diagram showing exemplary sensor responses of the bandstop filter of FIG. 1A in accordance with an embodiment of the present disclosure.

FIG. 1B is a diagram showing exemplary sensor responses of the bandstop filter of FIG. 1A in accordance with an embodiment of the present disclosure. Specifically, FIG. 1B shows calculated allpass 116 (i.e., the uppermost dotted line in FIG. 1130 and bandstop (i.e., the solid line in FIG. 1B) response. FIG. 1B shows a sensor response $S_{31}$ 120 for detector 110a (i.e. Sensor 1) between port 3 114a and input port 1 102a. FIG. 1B further shows a sensor response $S_{41}$ 122 for detector 110b (i.e. Sensor 2) between port 4 114b and input port 1 102a.

In FIG. 1B, the arrow 124 indicates where the sensor responses for sensor 1 120, with a peak at $\omega_{0s1}$, and sensor 2 122, with a peak at $\omega_{0s2}$ overlap, which in turn coincides with the center frequency $\omega_{0b}$ of the bandstop response. Note that equation (5) and equation (6) are only equal at frequency $\omega_{0b}$, the bandstop center frequency. Assuming a single interferer, the output voltages of detector 110 will be equal when the interferer frequency equals $\omega_{0b}$; if the interferer frequency is below $\omega_{0b}$, then the sensor 1 voltage 120 will be greater than the sensor 2 voltage 122, and vice versa if the interferer frequency is above $\omega_{0b}$.

3. Exemplary Self-Tuning Bandstop Filter

Figure 2A:
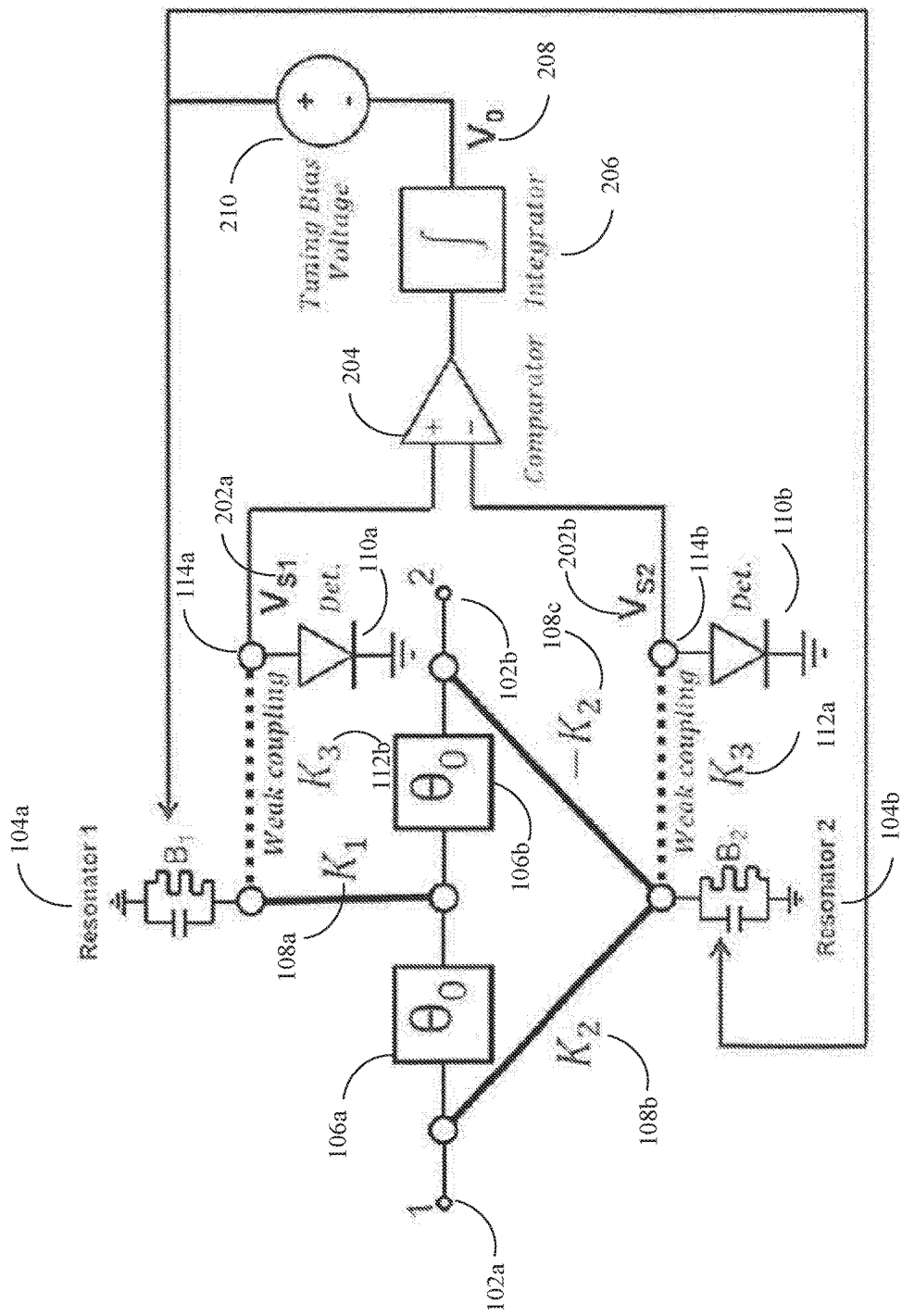
FIG. 2A is a diagram of a self-tuning bandstop filter in accordance with an embodiment of the present disclosure.

FIG. 2A is a diagram of a self-tuning bandstop filter in accordance with an embodiment of the present disclosure. In an embodiment, the relationship between output voltages of detector 110 and interferer frequency (e.g., the output voltages of detector 110 are equal when the interferer frequency equals $\omega_{0b}$) can be used to implement a self-tuning bandstop filter using a simple analog control circuit, as shown in FIG. 2A.

FIG. 2A adds an analog control circuit to the circuit of FIG. 1A. In an embodiment, detectors 110 generate voltages $V_{s1}$ 202a and $V_{s2}$ 202b based on power sensed from resonators 104 via their weak couplings to resonators 104. In an embodiment, the analog control circuit added in FIG. 2A automatically minimizes a difference between voltages $V_{s1}$ 202a and $V_{s2}$ 202b by tuning resonators 104 of the filter. In an embodiment, resonators 104 are designed to provide high attenuation at the center frequency of the tracked signal when the difference between tracked voltage is minimized by the analog control circuit of FIG. 2A.

In FIG. 2A, voltages $V_{s1}$ 202a and $V_{s2}$ 202b generated by detectors 110a and 110b, respectively, are fed into a comparator 204, which outputs either a positive or a negative voltage depending on the relative values of $V_{s1}$ 202a and $V_{s2}$ 202b. In FIG. 2A, the output of comparator 204 drives an integrator 206 that increases or decreases its output voltage $V_O$ 208, depending on the sign of the output voltage from comparator 204. In FIG. 2A, $V_O$ 208 is added to the tuning bias voltage of a tuner 210 that controls the tuning of both resonators 104a and 104b. In an embodiment, when $V_{s1}$ 202a and $V_{s2}$ 202b are equal, the center frequency of the filter of FIG. 2A is tuned to the interferer frequency, and $V_O$ 208 is held constant.

For example, in an embodiment, when a change in $V_O$ 208 is added to the tuning bias voltage of tuner 210, the capacitance of the capacitors in the resonators is altered because some or all of these capacitances are in the form of varactors or other switchable/tunable devices. This changes the resonant frequency of the resonators and therefore shifts the center frequency of the bandstop response. In an embodiment, since detectors 110 are co-designed with the resonators, the sensor response shifts in frequency with the bandstop response. When the sensor responses are equal, $V_O$ 208 remains constant, locking the bandstop and sensor responses to the frequency of the interferer until the interferer either moves in frequency (inducing a change in $V_O$), disappears, or is superseded by a more-powerful interfering signal.

The bandstop filter topology of FIG. 1A enables a bandstop response and provides filter-state-independent sensor locations in the circuit of FIG. 1A. Voltages $V_{s1}$ 202a and $V_{s2}$ 202b from detectors 110a and 110b, respectively, provide a way to tune the filter's resonators 104 either up or down in frequency to track an interfering signal. The additional control electronics added in FIG. 2A to the circuit of FIG. 1A direct resonators 104 to provide high attenuation at the frequency of a target (interfering) signal.

Figure 2B:
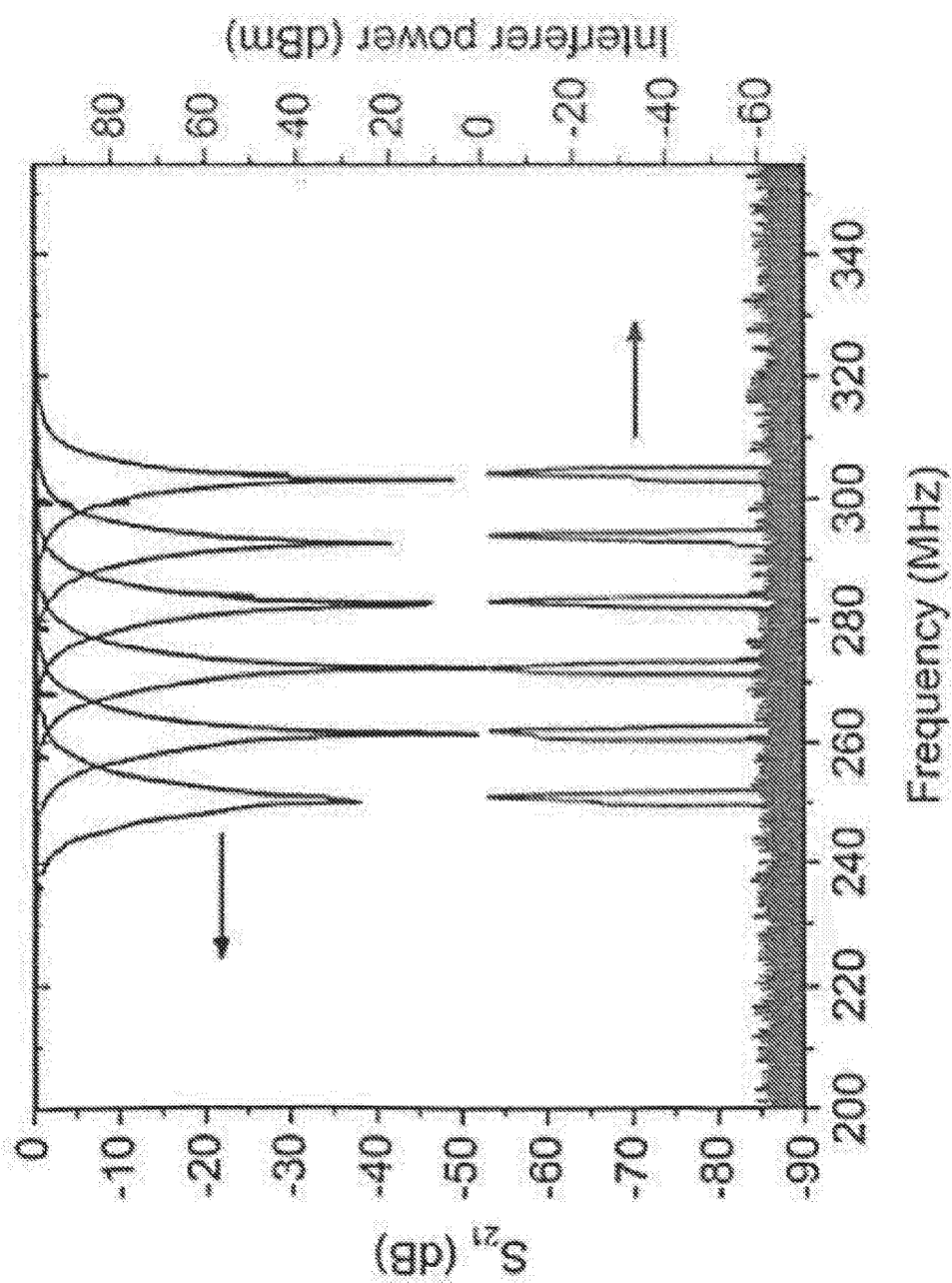
FIG. 2B is a diagram showing measurements of the self-tuning bandstop filter of FIG. 2A in accordance with an embodiment of the present disclosure.

FIG. 2B is a diagram showing measurements of the self-tuning bandstop filter of FIG. 2A in accordance with an embodiment of the present disclosure. Specifically, FIG. 2B shows measured small-signal insertion loss as a 0 dBm interferer is tuned from 251 MHz to 304 MHz and the spectrum of the tuned interferer. In FIG. 2B, the only thing that was adjusted in these measurements was the frequency of the 0 dBm interferer, and the filter was tuned automatically. In FIG. 2B, the notch 3 dB bandwidth ranges from 18 MHz at the lowest center frequency to 14.5 MHz at the highest center frequency.

4. Designing a Self-Tuning Bandstop Filter

While the control circuitry of FIG. 2A is shown added to the Bridged-T filter topology of FIG. 1A in FIG. 2A, it should be understood that control circuitry can be used to tune a variety of bandstop filter topologies in accordance with embodiment of the present disclosure. For example, in an embodiment elements 110, 204, 206, and 210 can be added to a bandstop filter with a different topology to provide a tunable bandstop filter in accordance with an embodiment of the present disclosure. Further, it should be understood that other control circuit elements (e.g., other than elements 110, 204, 206, and 210) can be used to tune resonators 104 (or other resonators in a different bandstop filter topology) in accordance with embodiments of the present disclosure. For example, in an embodiment, detectors 110 may not be diodes but may be some other type of power sensor.

Figure 3:
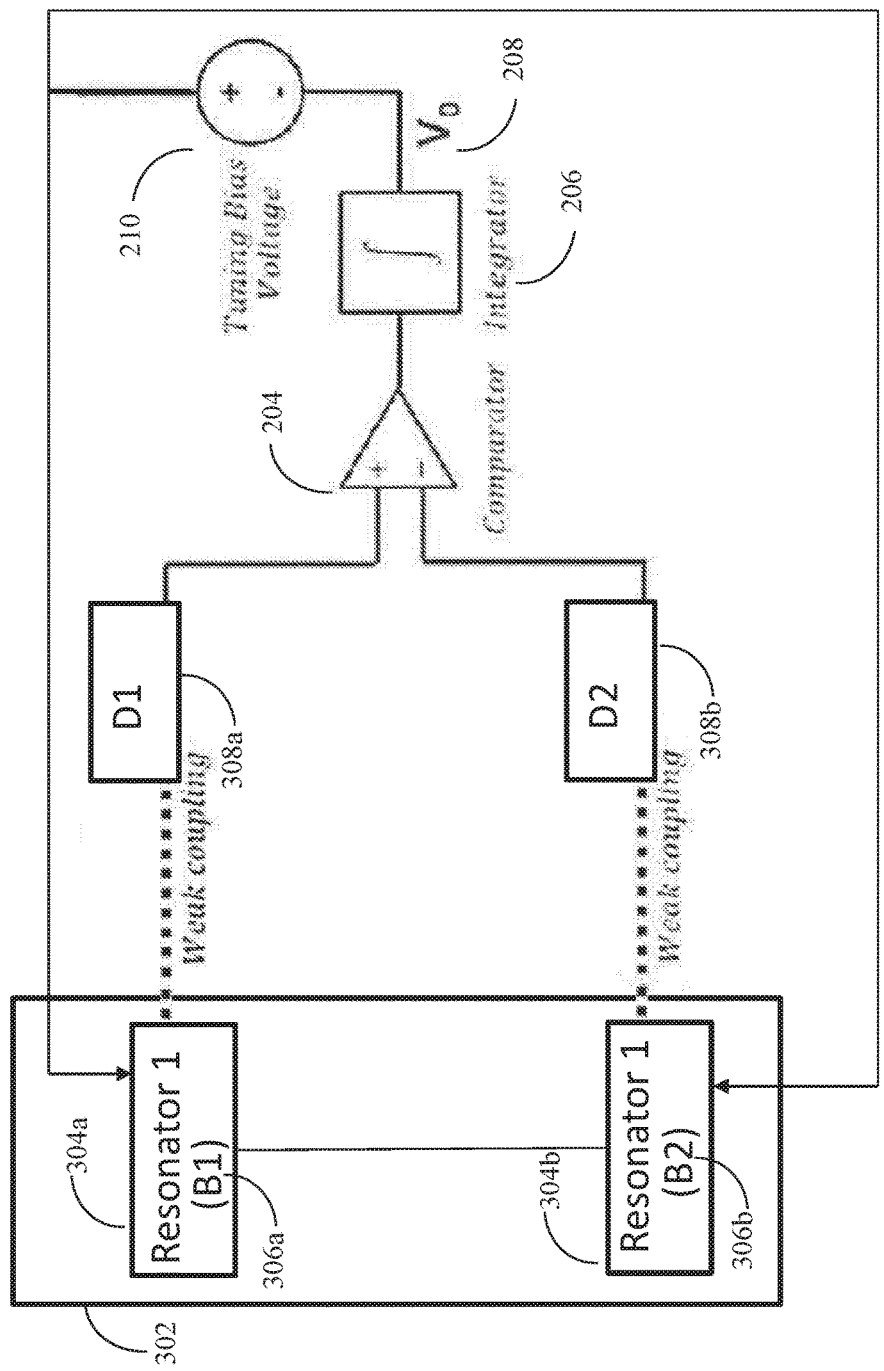
FIG. 3 is a diagram of an exemplary self-tuning bandstop filter in accordance with an embodiment of the present disclosure.

FIG. 3 is a diagram of an exemplary self-tuning bandstop filter in accordance with an embodiment of the present disclosure. FIG. 3 includes a bandstop filter 302 having at least two resonators 304 having susceptance values B1 306a and B2 306b. In an embodiment, bandstop filter 302 further includes additional resonators with additional susceptance values. Bandstop filter 302 can be implemented using a variety of filter topologies that have at least two resonators 306. In FIG. 3, resonator 1 304a is shown coupled to resonator 2 304b. This coupling can be direct or indirect in accordance with embodiments of the present disclosure. For example, in an embodiment, bandstop filter 302 includes other circuitry elements between resonators 304.

In FIG. 3, bandstop filter 302 is coupled to a control circuit (i.e., elements 308, 204, 206, and 210) to make bandstop filter 302 self-tunable. Resonator 1 304a is weakly coupled to detector D1 308a, and resonator 2 304b is weakly coupled to detector 308b. Detectors 308 can be detector diodes (e.g., as shown in FIGS. 1A and 2A) or some other kind of detector in accordance with embodiments of the present disclosure. In an embodiment, if bandstop filter 302 includes additional resonators, the control circuit can include additional detectors. For example, in an embodiment, bandstop filter 302 includes a third resonator weakly coupled to a third detector.

In an embodiment, detectors 308 sense power from resonators 304 via their weak coupling to resonators 304 and generate direct current (DC) voltages, which are input to comparator 204. In an embodiment, if the control circuit of FIG. 3 includes more than two detectors 308, the control circuit can include additional comparators. In FIG. 3, the output of comparator 204 is input to integrator 206, which drives integrator 206. Integrator 206 increases or decreases its output voltage $V_O$ 208, depending on the sign of the output voltage from comparator 204. In FIG. 2A, $V_O$ 208 is added to the tuning bias voltage of a tuner 210 that controls the tuning of resonators 304 of bandstop filter 302.

Figure 4:
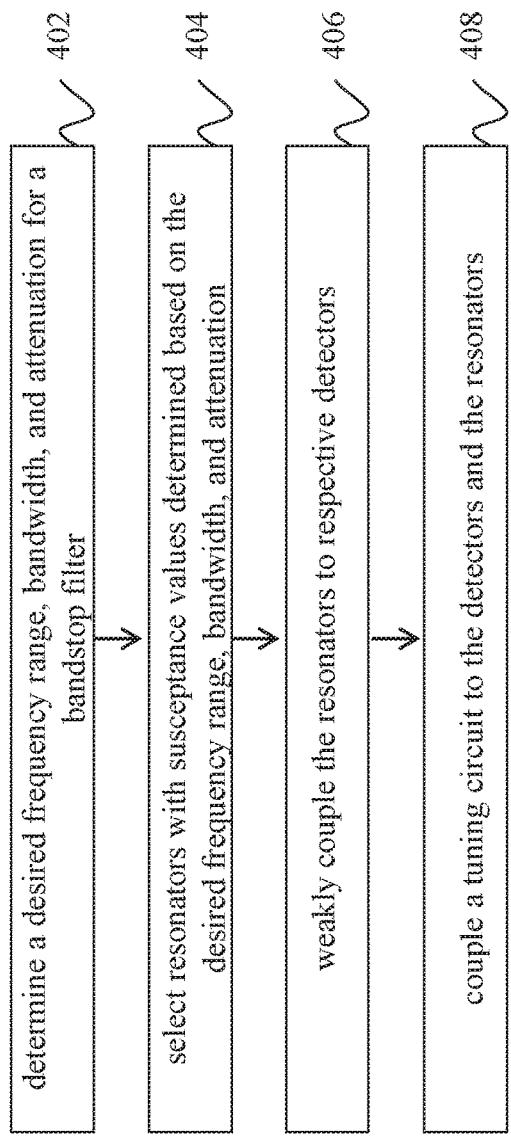
FIG. 4 is a flowchart of an exemplary method for creating a self-tuning bandstop filter in accordance with an embodiment of the present disclosure.

In an embodiment resonators 304 can be selected and/or configured based on desired parameters for bandstop filter 302. FIG. 4 is a flowchart of an exemplary method for creating a self-tuning bandstop filter in accordance with an embodiment of the present disclosure. In step 402, a desired frequency range, bandwidth, and attenuation for a bandstop filter are determined. For example, in an embodiment, selecting higher susceptance values 306 for resonators 304 shifts the response of bandstop filter 302 lower in frequency, and selecting lower susceptance values 306 for resonators 304 shifts the response of bandstop filter 302 lower in frequency.

In an embodiment, the difference between susceptance values 306 can be used to alter the bandwidth of bandstop filter 302. For example, in an embodiment, a larger difference in values between B1 306a and B2 306b will increase the bandwidth of bandstop filter 302, and a smaller difference in values between B1 306a and B2 306b will decrease the bandwidth of bandstop filter 302.

In an embodiment, selecting values for B1 306a and B2 306b involves a tradeoff between the slope of the notch response (i.e., attenuation) and bandwidth for bandstop filter 302. In an embodiment, the difference between susceptance values 306 can be used to alter the attenuation of bandstop filter 302. For example, in an embodiment, a larger difference in values between B1 306a and B2 306b will decrease the attenuation of bandstop filter 302, and a smaller difference in values between B1 306a and B2 306b will increase the bandwidth of bandstop filter 302.

In an embodiment, the strength of the coupling between resonators 304 and detectors 308 can be be so small (e.g., approximately 0.1% energy transfer in one embodiment) that it doesn't have to be considered when picking susceptance 306 or coupling 108. However, in an embodiment, if an application required that the detectors be more sensitive, a larger percentage of the energy could need to be coupled to them, and that could affect the filter response unless it was accounted for. For example, in an embodiment, susceptance values 306 can also be selected based on other factors such as the strength of the coupling between resonators 304 and detectors 308 and/or the specifications of detectors 308 (e.g., a power sensitivity of detectors 308—how much power is needed for detectors 308 to sense to be able to generate a voltage).

In an embodiment, susceptance values 306 can be selected based on a strength of internal couplings (e.g., reactance) between resonators 304 (e.g., based on the strength of couplings 108 in FIGS. 1A and 2A). While determining susceptance values has been discussed above with reference to the two susceptance values 306 shown in FIG. 3, it should be understood that embodiments of the present disclosure can include determining susceptance values for additional resonators of bandstop filter 302 (e.g., based on the same or similar factors discussed above).

In step 404, resonators are selected with susceptance values determined based on the desired frequency range, bandwidth, and attenuation. For example, in an FIG. 3, resonator 1 304a is selected with susceptance B1 306a, and resonator 2 304b is selected with susceptance B2 306b. In step 406, the resonators are weakly coupled to respective detectors. For example, in FIG. 3, resonators 304 are weakly coupled to detectors 308. In step 408, a tuning circuit is coupled to the detectors and the resonators. For example, in FIG. 3, elements 204, 206, and 210 are coupled to detectors 308 and resonators 304.

Embodiments of the present disclosure can be implemented using a wide range of technologies, including waveguide, coaxial, Low Temperature Co-Fired Ceramic (LTCC), etc. Embodiments of the present disclosure can be implemented using hardware, software, and/or a combination of hardware and software. Embodiments of the present disclosure can be implemented on a single device (e.g., on a single chip) or on multiple devices. Further, embodiments of the present disclosure can be incorporated into a host device to provide a tunable bandstop filter for the host device.

5. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present disclosure have been described above, it should be understood that they have been presented by way of example only, and not limitation. It will be apparent to persons skilled in the relevant art that various changes in form and detail can be made therein without departing from the spirit and scope of the disclosure. Thus, the breadth and scope of the present disclosure should not be limited by any of the above-described exemplary embodiments.

What is claimed is:

1. A bandstop filter, comprising:
   a first resonator, coupled to a first detector;
   a second resonator, coupled to the first resonator, wherein the second resonator is coupled to a second detector; and
   a control circuit, coupled to the first detector and the second detector, configured to tune the first resonator and the second resonator in response to detecting a first change in a first voltage at the first detector or a second change in a second voltage at the second detector.

2. The bandstop filter of claim 1, wherein the first resonator is weakly coupled to the first detector, and wherein the second resonator is weakly coupled to the second detector.

3. The bandstop filter of claim 1, wherein the first resonator is coupled to the second resonator in a Bridged-T filter topology.

4. The bandstop filter of claim 1, wherein the first detector is a first detector diode, and wherein the second detector is a second detector diode.

5. The bandstop filter of claim 1, wherein the control circuit comprises:
   a comparator, coupled to the first detector and the second detector;
   an integrator, coupled to an output of the comparator; and
   a tuner, coupled to an output of the integrator, wherein the tuner is configured to tune the first resonator and the second resonator.

6. The bandstop filter of claim 1, wherein the first detector and the second detector are configured such that the first voltage is equal to the second voltage when a frequency of an interfering signal is equal to a desired bandstop center frequency of the bandstop filter.

7. The bandstop filter of claim 1, wherein the control circuit is configured to tune the first resonator and the second resonator to minimize a difference between the first voltage and the second voltage.

8. The bandstop filter of claim 1, further comprising a third resonator coupled to the first resonator and the second resonator.

9. The bandstop filter of claim 8, further comprising a third detector weakly coupled to the third resonator.

10. The bandstop filter of claim 1, wherein a first susceptance value of the first resonator and a second susceptance value of the second resonator are selected based on a desired bandwidth of the bandstop filter.

11. The bandstop filter of claim 1, wherein a first susceptance value of the first resonator and a second susceptance value of the second resonator are selected based on a desired attenuation of the bandstop filter.

12. The bandstop filter of claim 1, wherein a first susceptance value of the first resonator and a second susceptance value of the second resonator are selected based on a desired frequency range of the bandstop filter.

13. The bandstop filter of claim 1, wherein a first susceptance value of the first resonator is selected based on a coupling strength between the first resonator and the first detector.

14. The bandstop filter of claim 1, wherein a first susceptance value of the first resonator is selected based on a power sensitivity of the first detector.

15. The bandstop filter of claim 1, wherein a first susceptance value of the first resonator is selected based on a coupling strength between the first resonator and the second resonator.

16. A bandstop filter, comprising:
a first resonator, coupled to a first detector; and
a second resonator, coupled to a second detector, wherein the first detector and the second detector are configured such that a first voltage at the first detector is equal to a second voltage at the second detector when a frequency of an interfering signal is equal to a desired bandstop center frequency of the bandstop filter.

17. The bandstop filter of claim 16, wherein the first detector and the second detector are coupled to a tuning circuit, and wherein the tuning circuit is coupled to the first resonator and the second resonator.

18. The bandstop filter of claim 17, wherein the tuning circuit is configured to tune the first resonator and the second resonator in response to detecting a first change in the first voltage or a second change in the second voltage.

19. A bandstop filter, comprising:
a first resonator, weakly coupled to a first detector diode;
a second resonator, coupled to the first resonator, wherein the second resonator is weakly coupled to a second detector diode;
a comparator, coupled to the first detector diode and the second detector diode;
an integrator, coupled to an output of the comparator; and
a tuner, coupled to an output of the integrator, wherein the tuner is configured to tune the first resonator and the second resonator.

20. The bandstop filter of claim 19, wherein the tuner is configured to tune the first resonator and the second resonator in response to detecting a first change in a first voltage at the first detector diode or a second change in a second voltage at the second detector diode.

* * * * *